(12) United States Patent
Madan (10) Patent No.: US 6,285,088 B1
(45) Date of Patent: Sep. 4, 2001

(54) COMPACT MEMORY CIRCUIT

(75) Inventor: Sudhir K. Madan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/305,993

(22) Filed: May 6, 1999

Related U.S. Application Data (60) Provisional application No. 60/085,354, filed on May 13, 1998.

(51) Int. Cl.[7] .............................. H01L 27/10; H01L 27/11
(52) U.S. Cl. ..................... 257/903; 257/904; 257/206; 257/207; 257/210
(58) Field of Search ............................. 257/206, 207, 257/210, 903, 904

(56) References Cited

U.S. PATENT DOCUMENTS

| | | | |
|---|---|---|---|
| 4,692,783 | * | 9/1987 | Monma et al. ................... 357/42 |
| 5,452,245 | * | 9/1995 | Hickman et al. ............... 257/206 |
| 5,923,060 | * | 7/1999 | Gheewala ....................... 257/207 |
| 5,932,900 | * | 8/1999 | Lin et al. ....................... 257/204 |
| 6,066,866 | * | 5/2000 | Omori ............................ 257/202 |

* cited by examiner

*Primary Examiner*—Minh Loan Tran
(74) *Attorney, Agent, or Firm*—Wade James Brady, III; Frederick J. Telecky, Jr.

(57) ABSTRACT

An integrated circuit having a memory cell array in which the strapping of cell components is accomplished within a memory cell. In one embodiment the strapping 750, 752, 756 is placed between the moats 706,724 of transistors that compose cross-coupled inverters within a static random access memory cell.

11 Claims, 8 Drawing Sheets

COMPACT MEMORY CIRCUIT

This application claims priority under 35 USC § 119(e)(1) of provisional application No. 60/085,354 filed May 13, 1998.

FIELD OF THE INVENTION

This invention relates to semiconductor integrated circuits, and more specifically to memory integrated circuits.

BACKGROUND OF THE INVENTION

Memory circuits typically comprise an extremely densely packed array of storage elements or cells: capacitors in dynamic RAMs and cross-coupled inverters in static RAMs. Much effort has been aimed at reducing the dimensions of each of these storage cells to allow ever greater memory capacity for a given amount of semiconductor die space. As the dimensions of the cell components decrease, the effects of the parasitic resistances increase. This is in part due to the relatively enormous lengths of the wordlines and bitlines as compared to the memory cell dimensions. For example, as wordlines are made narrower to allow placement within the memory cell, the resistance of the lines increase. The increased resistance makes the time constant of the line unacceptably high, and a high time constant results in slow memory access times. A solution to this problem has involved tying or strapping the local wordline (typically comprising polycrystalline silicon) to an upper-level metal bus to produce an overall lower wordline resistance. In this approach the local poly wordline is strapped to the metal bus every eight, sixteen, thirty-two or more memory cells, depending upon the access time requirements of the circuit. A drawback of the wordline strap is that typically in prior art designs no space existed within a memory cell for the strap. Consequently, the periodic placement of memory cells was interrupted every eight, sixteen, thirty-two, or more cells to allow space for a strap.

An additional reason for the strap space between blocks in SRAMs is to allow contact for the bias voltage (Vdd) to the n-type well region in which the p-channel MOS transistors of the SRAM cell are formed. Similarly, the strap space allows contact between the Vss bus (typically tied to a reference potential or electrical ground) and the p-type substrate or well. Periodic placement of these contacts within the cell array helps prevent latchup and ensure proper circuit operation.

Figure 1:
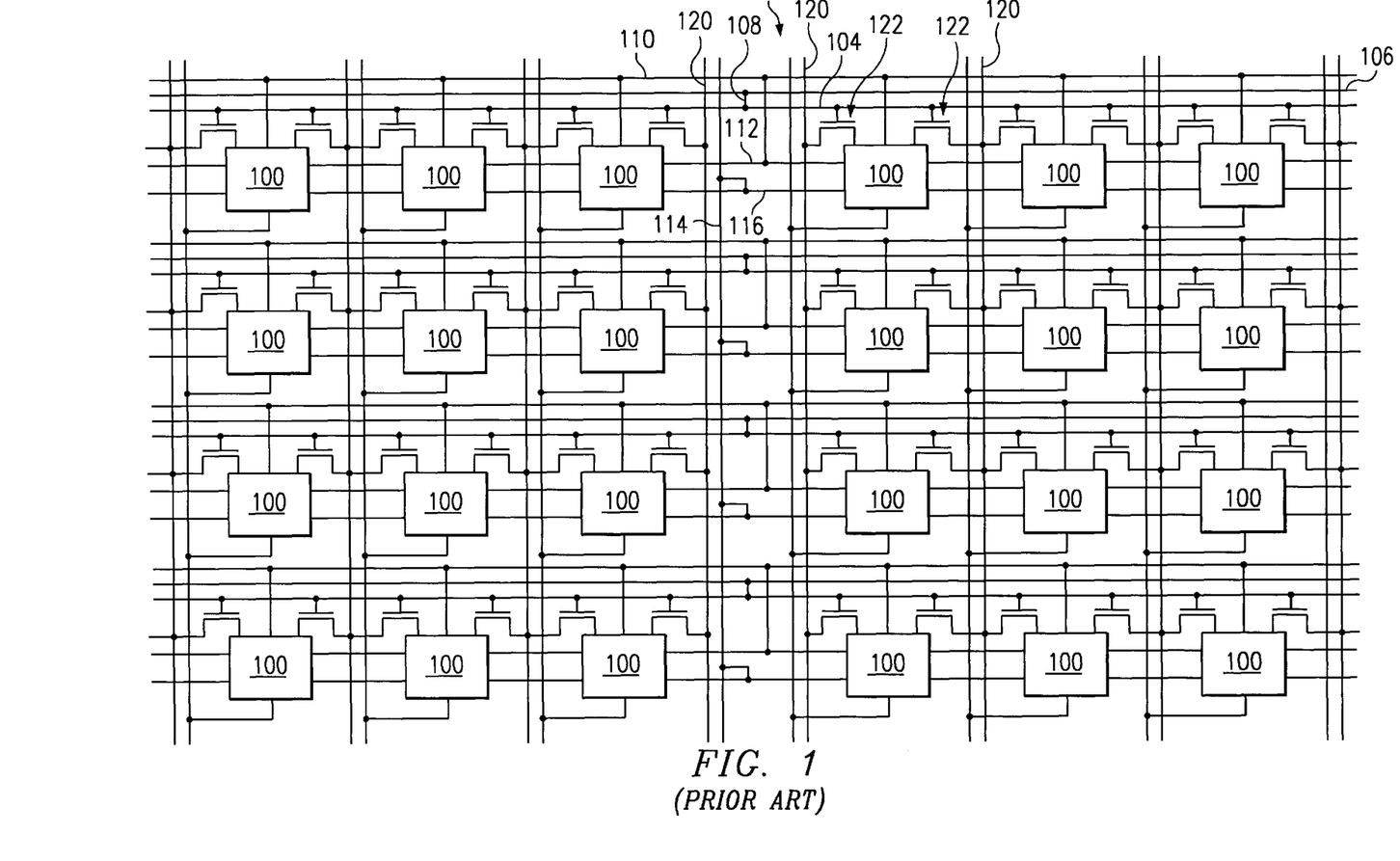
FIG. 1 is a schematic diagram of a prior art strap configuration in a SRAM cell array.

FIG. 1 is a schematic representation of a prior art SRAM circuit. Two groups of storage cells 100 are separated by a strap column 102 in which a polycrystalline silicon ("poly") wordline 104 is connected or strapped to metal wordline bus 106 at a point 108 within the strap column. In addition, Vdd bus 110 is strapped to element 112, which represents the common n-type doped region or well in which the p-channel MOS transistors of cells 100 are formed. Similarly, Vss bus 114 is strapped to element 116, which represents the common p-type substrate in which the n-channel MOS transistors of cells 100 are formed. Note that each of these strap connections is replicated for each row of cells 100. Each cell column is bounded by bitlines and complementary bitlines 120, and is coupled to a bitline and complementary bitline by pass or access transistors 122.

Figure 2:
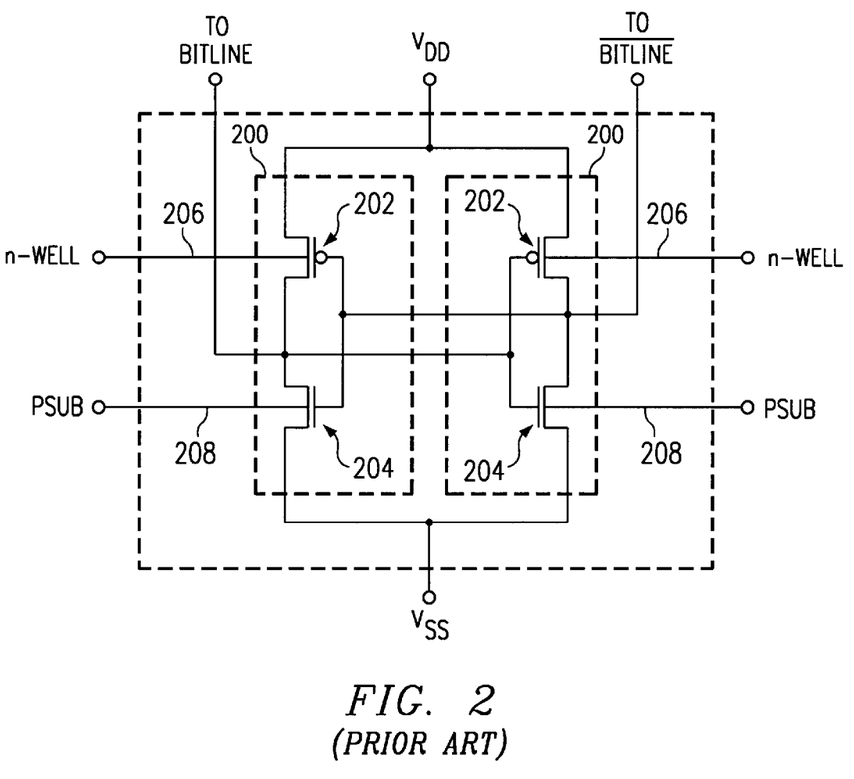
FIG. 2 is a schematic diagram of a prior art static memory cell.

FIG. 2 is a schematic diagram of a typical prior art memory cell such as is shown in FIG. 1 as element 100. The cell is made up of cross-coupled inverters 200. Each inverter 200 includes a p-channel pull-up MOS transistor 202 and an n-channel pull-down MOS transistor 204. Terminals 206 represent the common n-type doped well in which the p-channel transistors are formed. Similarly, terminals 208 represent the p-type substrate, or in the case of a twin-well process, the p-type well, in which the n-channel MOS transistors are formed.

Figure 3:
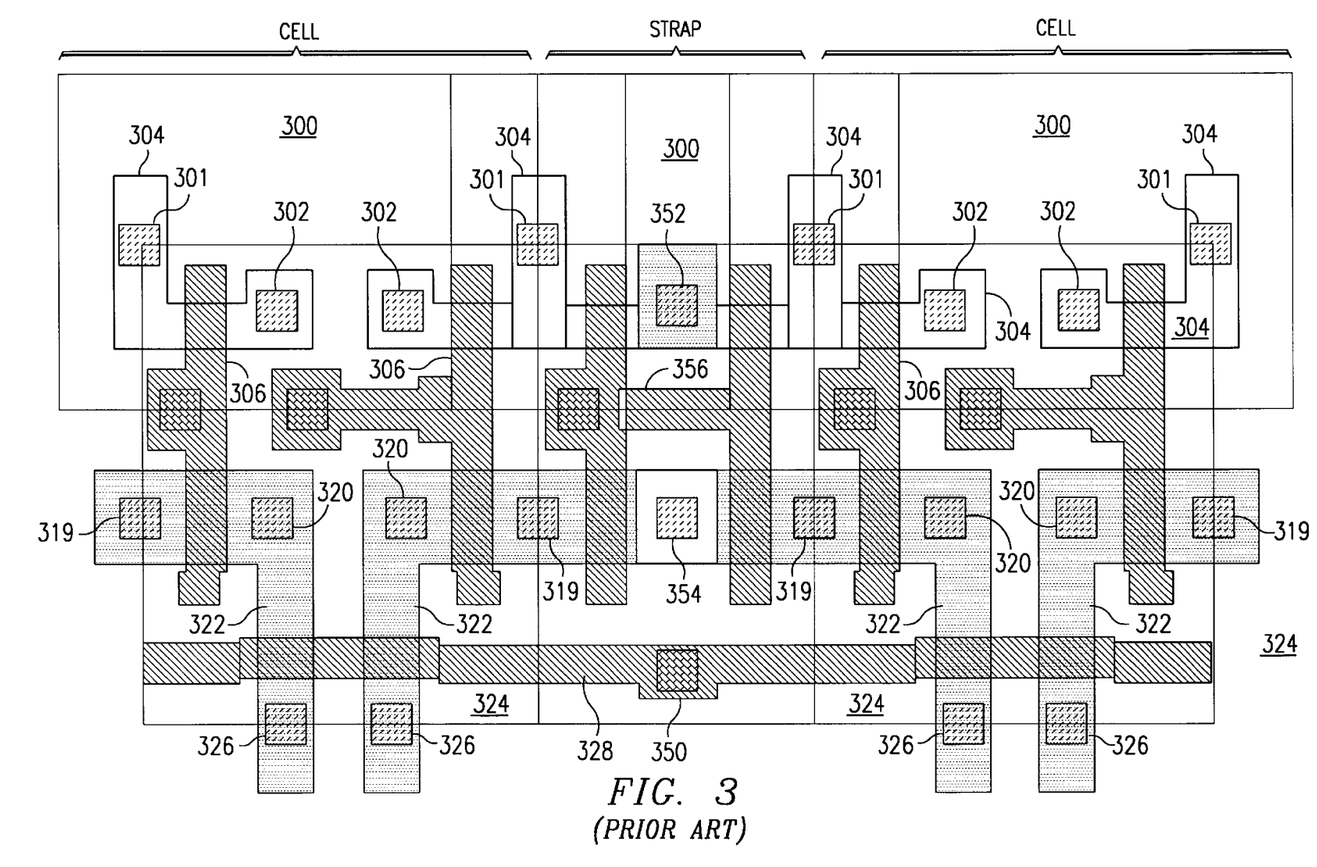
FIG. 3 is a prior art layout for a two memory cells and a strap column.

FIG. 3 is a prior art layout (exclusive of the metal interconnections) of two storage cells separated by a strap column. Within each cell, p-channel transistors are formed within an n-type well region 300. The p-channel transistors have p-type source contacts 301 and drain contacts 302 formed in moat region 304 within n-well 300. The moat regions are bounded by field oxide. Poly gate structures 306 extend over the moat and field oxide regions. The channel for the p-channel transistor is formed in the moat region 304 between the source and drain contacts 301 and 302. The conductive state of the channel is controlled through application of an appropriate voltage on the gate 306. Similarly, the n-channel transistors have n-type source contacts 319 and drain contacts 320 formed in moat region 322, which is formed in the p-type substrate 324. As shown in the schematic diagram of FIG. 2, the gates of the p-channel and n-channel transistors comprising an inverter are connected. Thus the gate poly 306 extends over both moats 304 and 322. Note also that with one additional source/drain contact 326, the pass transistor that couples the cell to the bitline is also formed in moat 322. Poly wordline 328 forms the gate of the pass transistors.

The wordline is widened at a point 350 in the strap column to facilitate contact between the poly local wordline and a wordline bus formed subsequently in an upper level metal interconnect layer. The strap column also contains an n-type ohmic contact 352 to the n-type well 300 and a p-type ohmic contact 354 to the p-type substrate. The contacts 352 and 354 are connected to the Vdd and Vss buses, respectively, that are formed subsequently in an upper level metal interconnect layer. The dummy poly gate structure 356 in the strap column is used to compensate for optical proximity effects that would otherwise influence the gate lengths in the transistors adjacent the strap column. The gate structure 356 physically emulates the gate structure 306 that would be adjacent a cell within the array away from the strap column. The gate structure 356 is typically coupled to either the Vss or Vdd bus.

The penalty for the inclusion of the strap column shown in FIG. 3 is approximately 4.4% in a design that employs strap columns every sixteen memory cells. A reduction of this penalty would allow more storage cells for a given die area, and more integrated circuits per silicon wafer. Thus, there is a need in the industry for a more compact arrangement.

SUMMARY OF THE INVENTION

In accordance with a preferred embodiment of the invention, there is disclosed an integrated circuit having a memory cell array in which the strapping of cell components is accomplished within a memory cell. This approach consumes less semiconductor die space than the prior art method of strapping cell components in an area between cells.

BRIEF DESCRIPTION OF THE DRAWINGS

The foregoing features of the present invention may be more fully understood from the following detailed description, read in conjunction with the accompanying drawings, wherein:

FIG. 5b is a layout of first and second interconnect levels of the layout shown in FIG. 5a;

FIG. 6 is an enlarged view of one of the conventional cells shown in FIG. 5a; and FIG. 7 is an enlarged view of one of the strap cells shown in FIG. 5a.

DETAILED DESCRIPTION OF PREFERRED EMBODIMENTS

Figure 4:
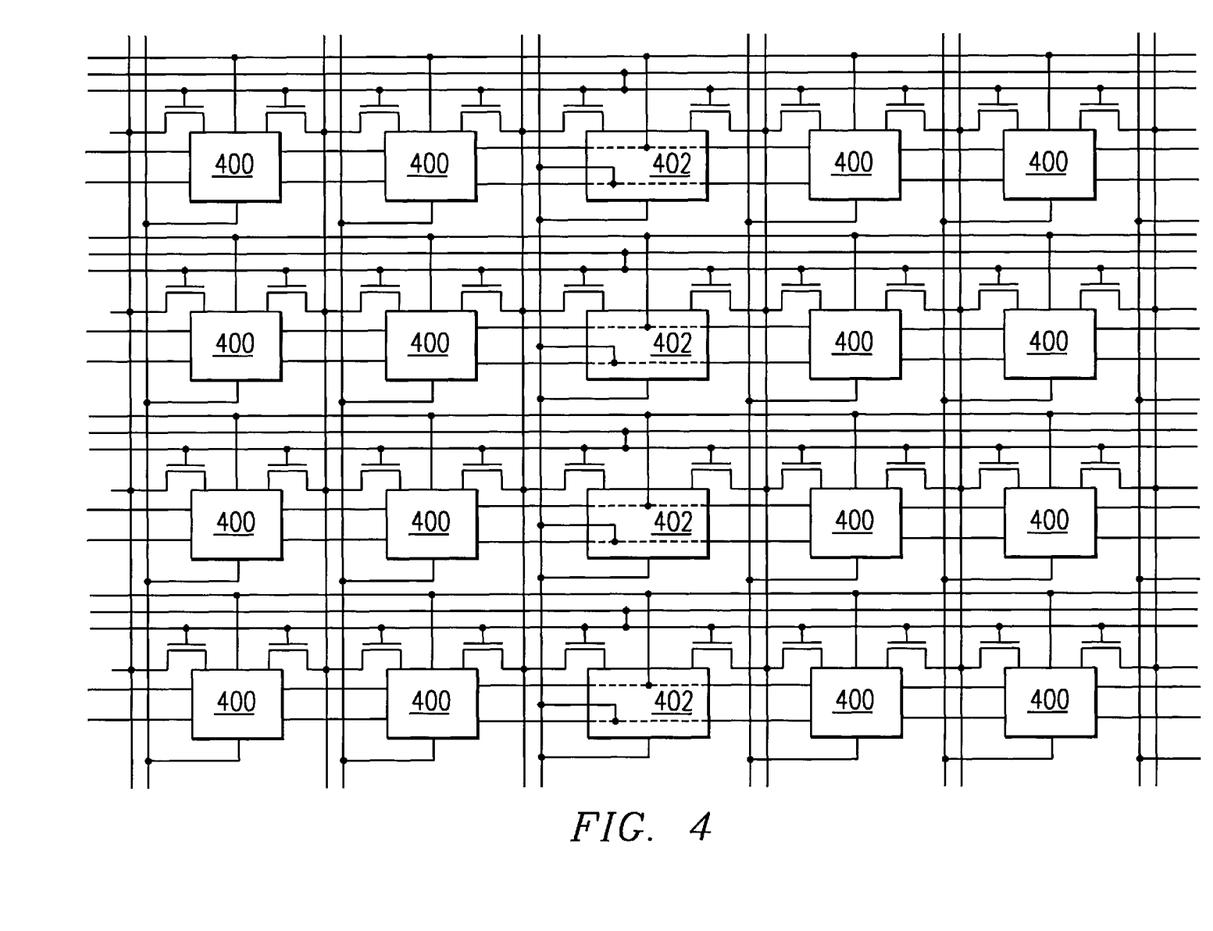
FIG. 4 is a schematic diagram of a memory cell array of an embodiment in accordance with the invention.

A first preferred embodiment memory circuit in accordance with the invention is shown schematically in FIG. 4. The circuit comprises two types of memory cells. Memory cells 400 are of the configuration shown in FIG. 2 or an equivalent fourtransistor configuration using load resistors. Strap cells 402 are arranged to incorporate the connections made in the strap column of FIG. 3. By placing the strap connections within a memory cell, the dimension penalty for including straps every sixteen cells can be reduced by more than one-half.

Figure 5A:
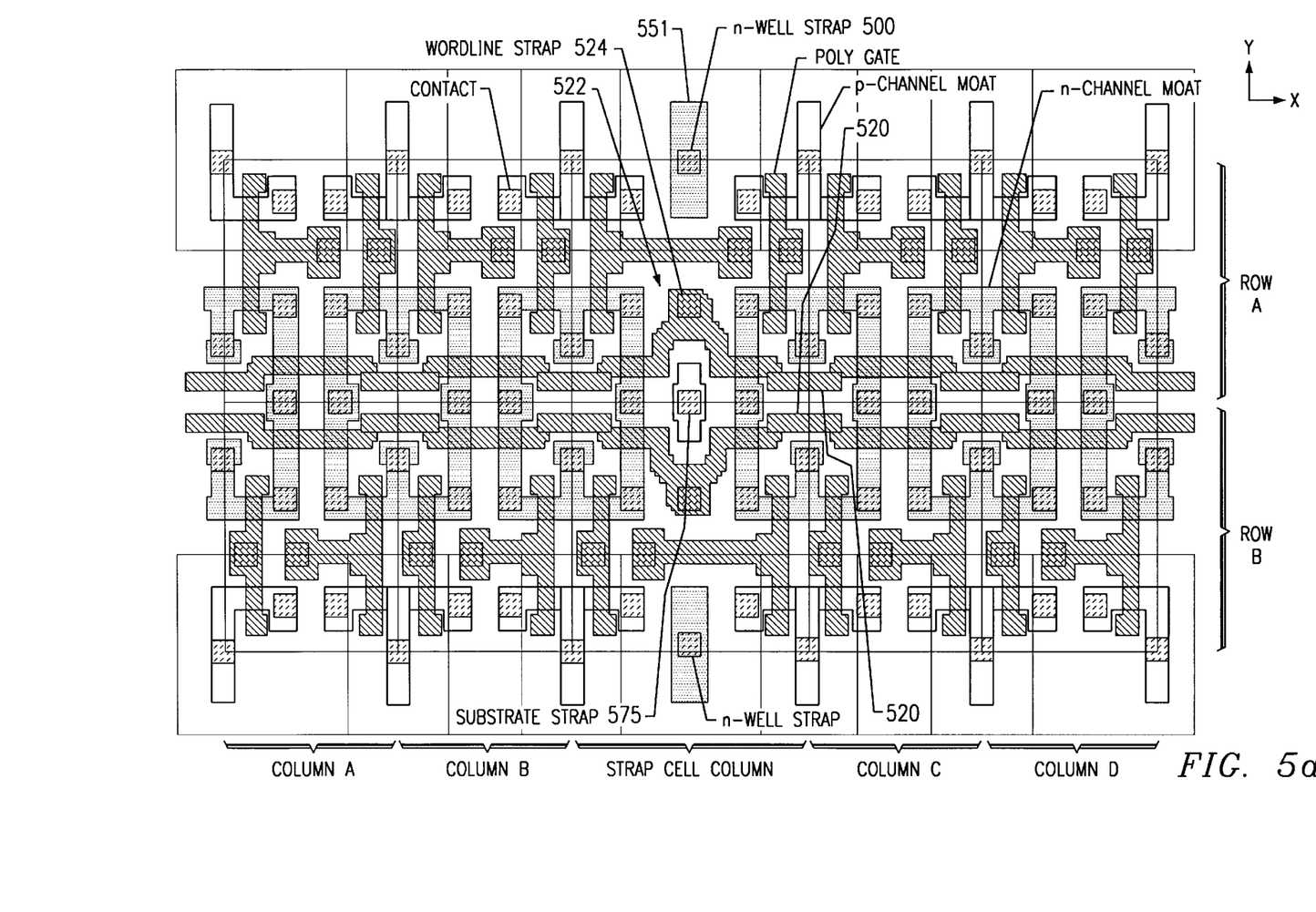
FIG. 5a is a layout of substrate and poly levels of an embodiment array comprising eight conventional memory cells and two strap cells.
Figure 5B:
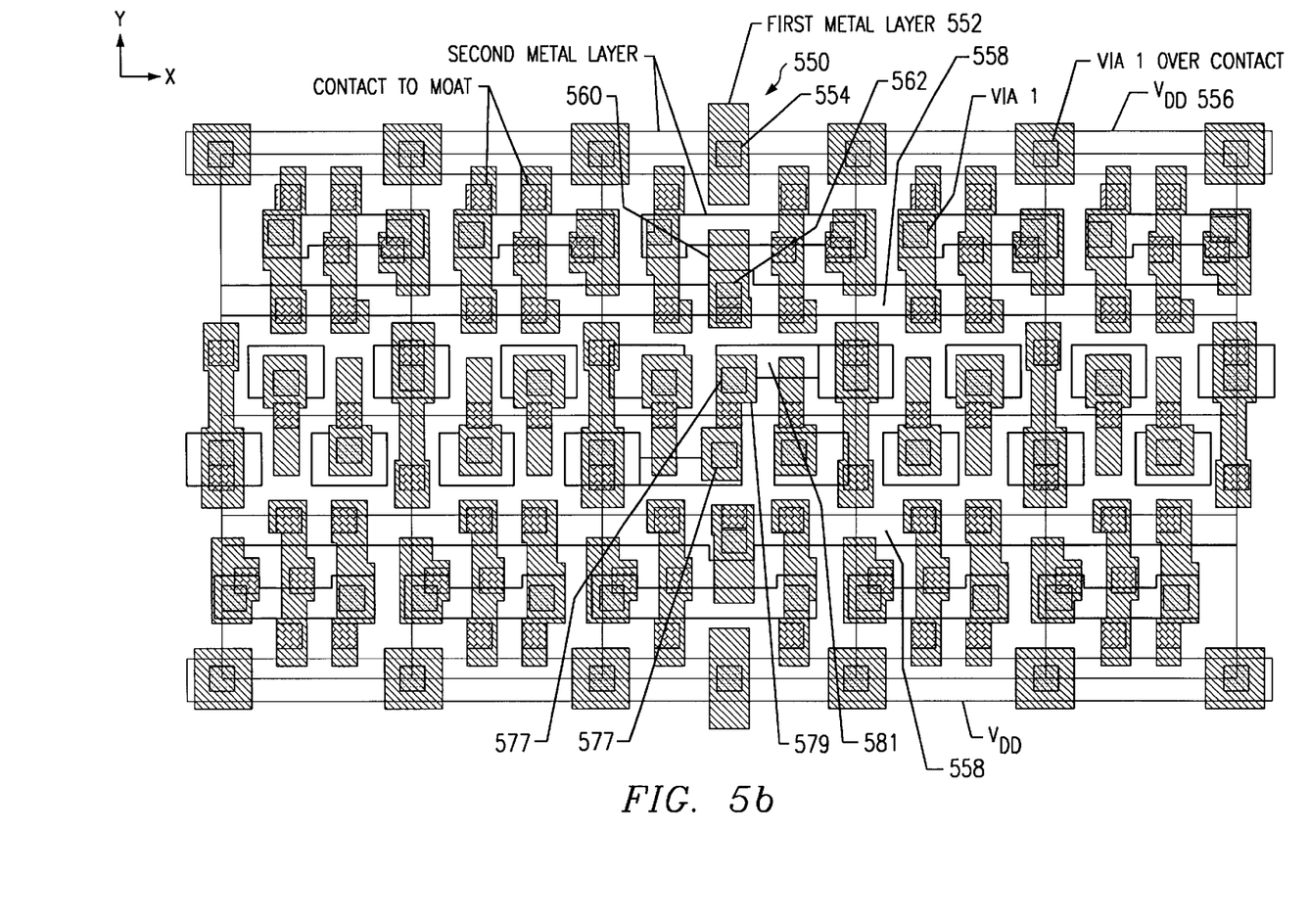
Figure 5C:
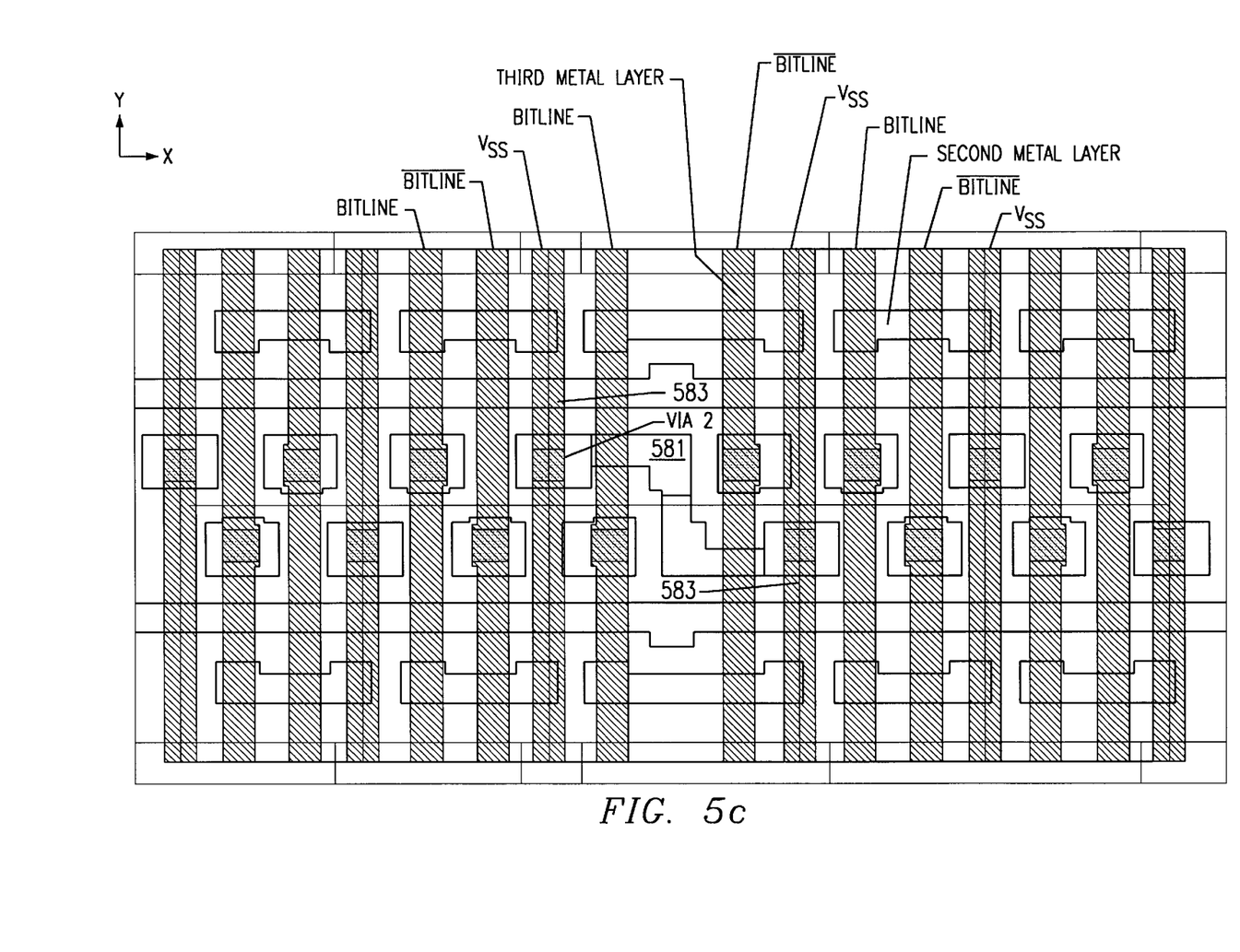
FIG. 5c is a layout of second and third interconnect levels of the layouts shown in FIGS. 5a and 5b.

FIGS. 5a, 5b, and 5c are various levels of a first preferred embodiment memory circuit layout. Two rows of cells are shown in these figures. In each row a strap cell is bounded by two conventional memory cells on each side. Thus, a total of ten cells are shown in FIG. 5a. FIG. 5a shows moats, moat and poly contacts to the first metal layer, and poly layers of the layout. FIG. 5b shows the first and second metal layers that overlie the features shown in FIG. 5a. FIG. 5c shows the second metal layer and the third metal layer.

The cell in Row B of a given column is a mirror image in both the x- and y-directions of the cell in Row A of the same column. Also, between adjacent cells (excluding the strap cell) some portions of the metal and via patterns are mirrored, whereas other portions are replicated or stepped from cell to cell. In the description of the embodiments that follows, no distinction is made between these conventional cells. For a larger array, a combination of two adjacent cells in Row A and two adjacent cells in Row B are stepped in the y-direction. The skilled artisan will appreciate that there are various ways to generate an array. For example, the cells in Row A and B need not mirror one another in both the x- and y-directions as in this embodiment. Also, note that only a small portion of the total memory cells for a circuit that may contain millions of cells is shown in FIG. 5a.

The first metal layer shown in FIG. 5b is separated from the poly structures and substrate surface shown in FIG. 5a by a dielectric layer (not shown) such as $SiO_2$, borophosphosilicate glass, and so forth. Similarly, the second metal layer is separated from the first metal layer in FIG. 5b by another layer of dielectric (not shown). The same is true between the second and third metal layers shown in FIG. 5c. The contacts (Via 1) between the first and second metal layers are shown in FIG. 5b, and the contacts (Via 2) between the second and third metal layers are shown in FIG. 5c.

The strapping of the Vdd bus to the n-well is indicated generally by element 550 in FIG. 5b. The strap comprises a contact 500 to the n-well moat 551 (FIG. 5a); a pad 552 formed in the first metal layer (FIG. 5b); a contact between first metal layer 552 and the n-well moat 551; and a via 554 between the first metal layer and the Vdd bus 556, which is formed in the second metal layer;

The strapping of the local poly wordline 520 to the wordline bus is indicated generally by element 522 in FIG. 5a. The poly wordline 520 is coupled at contact 524 (FIG. 5b) to pad 560 formed in the first metal layer. Pad 560 is then coupled to the wordline bus 558 at the Via 1 contact 562 in FIG. 5b.

The bitlines, complementary bitlines, and Vss bus are formed in the third metal layers (FIG. 5c). The substrate strap comprises the contact 575 between the substrate and the first metal layer shown in FIG. 5a, the Via 1 contacts 577 between the first metal layer 579 and the second metal layer 581 shown in FIG. 5b, and the Via 2' contact between the second metal layer 581 and the Vss bus 583 in the third metal layer in FIG. 5c.

Figure 6:
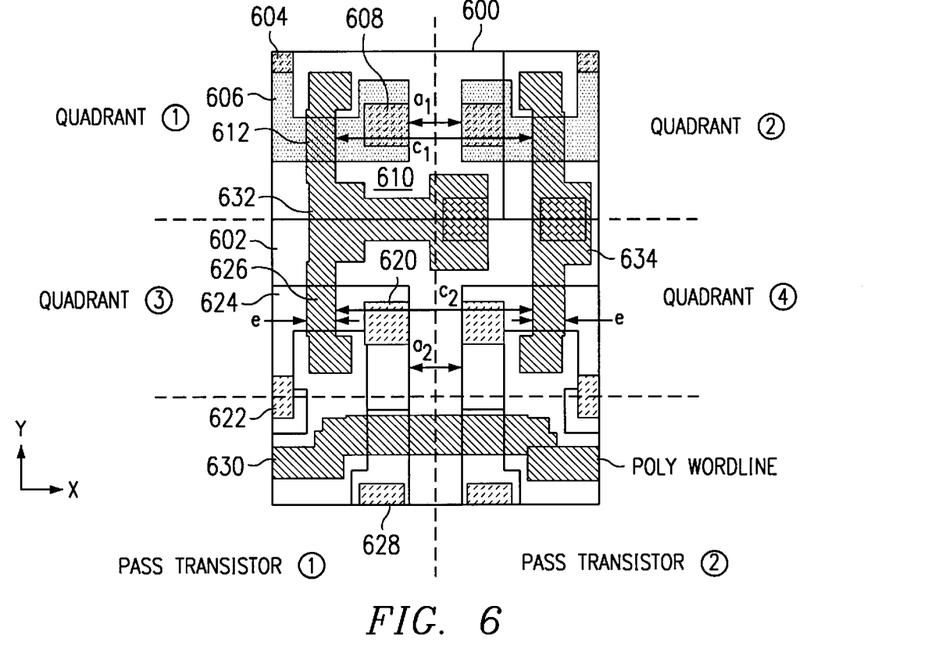

Referring to FIG. 5a, the memory cell in Row A, Column C will be described in detail. To facilitate the description, the cell is shown in isolation in FIG. 6. The memory cell comprises two cross-coupled inverters. Each inverter includes a p-channel MOS transistor and an n-channel MOS transistor. The layout in FIG. 6 is divided by dashed lines to separate the locations of each of the four transistors that constitute the two inverters from each other and from the two pass transistors that allow activation of the cell. A first inverter comprises the transistors in Quadrants 1 and 3, while the second inverter comprises the transistors in Quadrants 2 and 4. Quadrants 1 and 2 are formed in an n-type well 600, while Quadrants 3 and 4 are formed in the p-type substrate 602. In Quadrant 1, p-type source contact 604 for the p-channel transistor is formed in moat region 606. P-type drain contact 608 is also formed in moat region 606. Note that moat region 606 is within n-well 600. Surrounding moat region 606 is field oxide 610 over the n-well 600. Poly gate 612 lies over the channel region in moat 606 that lies between the source 604 and drain 608 contacts. The first inverter also includes the n-channel transistor formed in Quadrant 3. N-type drain 620 and source 622 contacts are formed in moat 624, which is in turn formed in p-type substrate 602. Gate 626 is formed of the same poly structure that forms the gate 612 of the p-channel transistor in Quadrant 1, except that the doping of gate 612 is p-type, whereas that of gate 626 is n-type. Pass transistor 1 shares drain contact 620 and moat region 624 with the n-channel transistor in Quadrant 3. Source contact 628 of pass transistor 1 is also formed in moat region 624. The gate 630 of the pass transistor is the poly wordline. The second inverter formed in Quadrants 2 and 4 and pass transistor 2 are essentially mirror images of the inverter formed in Quadrants 1 and 3 and pass transistor 1. The poly structures 632 and 634 that comprise the gates in the first and second inverters, respectively, are shaped differently to facilitate routing in the subsequently-applied metal layers.

The p-channel and n-channel transistor drain regions of the first and second inverters are separated or offset by a distance of approximately 0.35 um (for 0.25 um design rule technology), shown in FIG. 6 as distances "a1" and "a2". In the preferred embodiment distances a1 and a2 are equal and the distance or offset "a" between the moats of the two inverters is defined as the mean value of the distances a1 and a2. The offset is in the x-direction and the bitlines (FIG. 5c) run in the y-direction. The offsets for the p-channel and n-channel transistor gates of the first and second inverters, marked as distances "c1" and "c2", respectively, in FIG. 6, are equal in the preferred embodiment and are approximately 1.35 um. The distance or offset "c" between the gates of the two inverters is defined as the mean value of the distances c1 and c2.

Figure 7:
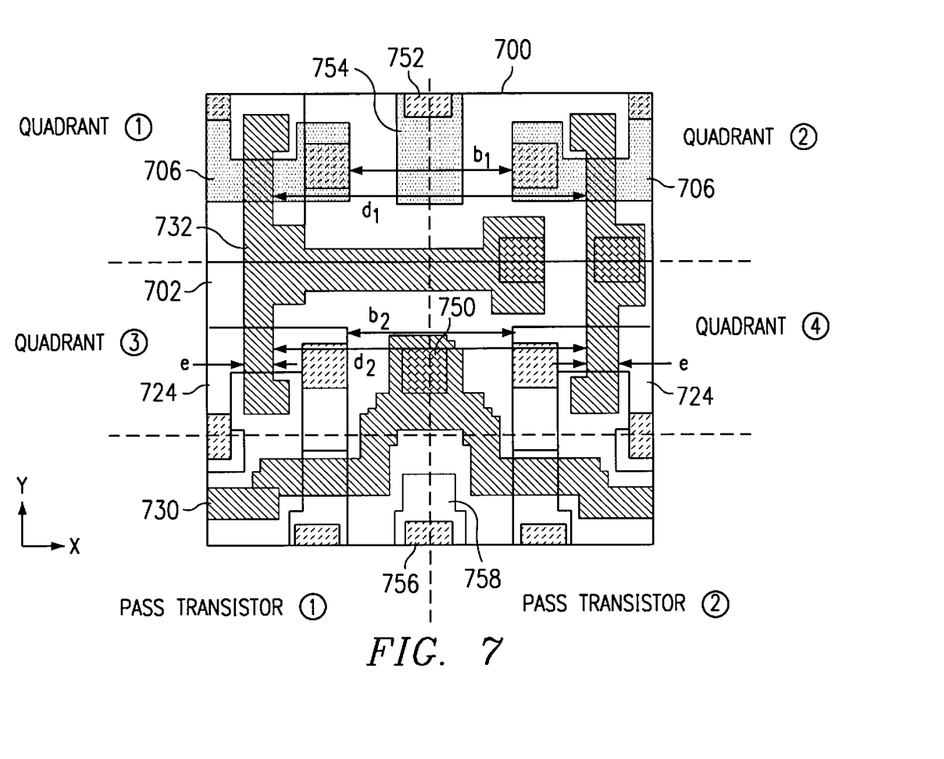

The strap cell in Row A of FIG. 5a is shown in isolation in FIG. 7. Note that the transistors in each of the quadrants have the same layout as in FIG. 6. The layout of the strap cell in FIG. 7 differs from the conventional cell of FIG. 6 in that the moat spacing "b" in FIG. 7, defined as the mean of the distance between the p-channel transistor moats "b1" and the distance between the n-channel transistor moats "b2" of the two inverters, is larger than the distance "a" defined above for the conventional cell. Similarly, the gate spacing "d" defined as the mean of the distance between the p-channel transistor gates "d1" and the distance between the n-channel transistor gates "d2" of the two inverters, is larger than the distance "c" defined above for the conventional cell. In the preferred embodiment of FIG. 7, the distances "b" and "d" are approximately 1.15 um and 2.15 um, respectively. For these purposes a distance is considered approximately the same if it differs by less than two times the gate length marked as "e" in the FIGS. 6 and 7 of the n-channel transistors used in the inverters. A distance is larger if it is greater than two times the gate length of the n-channel transistors of the inverters. The gate length "e" in the FIGS. 6 and 7 is approximately 0.21 um (for a 0.25 um design rule technology).

The p-channel transistor moats are labeled 706 and the n-channel transistor moats are labeled 724. The poly wordline is coupled to the metal wordline bus (shown in FIG. 5b) via contact 750. The n-well 700 (the same doped region as n-well 600 in FIG. 5a) is coupled to supply voltage Vdd bus (shown in FIG. 5b) via contact 752. To ensure that contact 752 is ohmic, the contact is formed in moat region 754, formed by implantation of n-type dopants into n-well 700. Similarly, the strap contact 756 to the p-type substrate is formed in p-type implanted region 758. The p-substrate contact 756 is coupled through first and second metal layers to a Vss bus in the third metal layer (see FIGS. 5b and 5c).

The strap cell approach reduces the area of the cell array occupied by the periodic strapping of the wordline, n-well, and substrate described above. In the prior art approach shown in FIG. 3, the dummy poly gate structure 356 is used to physically approximate the gate structure of a memory cell. Because of undesired interference in the radiation used to define small structures, it is preferable that critical structures such as transistor gates be photolithographically resolved in physically similar circumstances throughout the integrated circuit. Thus, the prior art approach devotes considerable space within the strap column to the dummy poly gate structure to ensure that the dimensions of the transistor gates adjacent the strap column are the same as gate dimensions elsewhere within the memory cell array.

In the approach shown in FIG. 5a, on the other hand, no such dummy poly gate structure is used. Indeed, the physical features of the strap cell are similar, if not identical, to those of a conventional memory cell where the strap cell abuts the adjacent cell. Thus, the space occupied by the dummy gate structure in avoided in the embodiment approach. In addition, the strap cell is a fully functioning memory cell. The strap cell in this embodiment only differs from a conventional cell with regard to the wider spacing between the drains used to form transistors for the memory cell inverters. The wider spacing allows the insertion of the strap connections. Note that the strap cell may be configured differently from the standard cell and still provide a strap area and features that lessen the impact of photolithographic proximity effects.

In another embodiment an epitaxial silicon substrate is used. This provides a low resistance path for substrate current and allows for the omission of strap connections to the substrate.

In the embodiments described above n-type wells are formed in a p-type substrate. Alternatively, if an n-type substrate is used, p-wells are formed, and in this n-type substrate embodiment, n-channel transistors are formed in p-wells and p-channel transistors are formed in the n-type substrate. In an embodiment using a silicon-on-insulator (SOI) substrate, the p-substrate and n-well straps described above may be omitted. Also, in the embodiments described above, the pass or access transistors are n-channel. The skilled artisan will appreciate that p-channel transistors could alternatively be used.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, The concepts described herein may be applied to DRAMs, ROMs, and other integrated circuits. In addition, the cell layout may differ from that described in these embodiments without deviating from the scope of the invention. Furthermore, the embodiment memory circuits described herein could be embedded on an integrated circuit with a processor such as a microprocessor or digital signal processor. It is therefore intended that the appended claims encompass any such modifications or embodiments.

What is claimed is:

1. An integrated circuit, comprising:
   an array of storage cells, said array comprising a series of groups of storage cells of a first type interrupted periodically by a group of storage cells of a second type, said storage cells of said second type differing from said cells of said first type in at least one aspect by comprising a contact area; and
   a bus disposed adjacent said array, said bus coupled to said array at said contact area.

2. The integrated circuit of claim 1, wherein said storage cells comprise cross-coupled inverters.

3. The integrated circuit of claim 1, wherein said storage cells comprise a capacitor.

4. An integrated circuit, comprising:
   an array of storage cells, said array comprising a series of columns of storage cells of a first type interrupted periodically by a column of storage cells of a second type,
   said first storage cell type including first and second transistors, said first transistor having a channel region in a first moat and said second transistor having a channel region in a second moat, said first and second moats separated by a first distance;
   said second storage cell type including third and fourth transistors, said third transistor having a channel region in a third moat and said fourth transistor having a channel region in a fourth moat, said third and fourth moats separated by a second distance, wherein said second distance is greater than said first distance.

5. The integrated circuit of claim 4, further comprising a bus disposed adjacent said array, said bus coupled to said array at a contact area between said third and fourth moats.

6. An integrated circuit including an array of storage cells, said array comprising a series of columns of storage cells of a first type interrupted periodically by a column of storage cells of a second type, said first cell type including first, second, third, and fourth transistors, said first transistor having channel region formed in a first moat, said second transistor having a channel region formed in a second moat, said third transistor having a channel region formed in a third moat, and said fourth transistor having a channel region formed in a fourth moat, said first and second transistors being of the n-channel type and said third and fourth transistor being of the p-channel type, said first and second moats separated by a first distance, said third and fourth moats separated by approximately said first distance;

said second cell type including fifth, sixth, seventh, and eighth transistors, said fifth transistor having a channel region in a fifth moat, said sixth transistor having a channel region in a sixth moat, said seventh transistor having a channel region in a seventh moat, and said eighth transistor having a channel region in an eighth moat, said fifth and sixth transistors being of the n-channel type and said seventh and eighth transistors being of the p-channel type, said fifth and sixth moats separated by a second distance, said seventh and eighth moats separated by approximately said second distance, wherein said second distance is greater than said first distance.

7. The integrated circuit of claim 6, further comprising a bus disposed adjacent said array, said bus coupled to said array at a contact area between said fifth and sixth moats and said seventh and eighth moats.

8. The integrated circuit of claim 6, further comprising a pair of access transistors coupling each of said storage cells in said array with a pair of bitlines.

9. An integrated circuit including an array of storage cells, said array comprising a series of columns of storage cells of a first type interrupted periodically by a column of storage cells of a second type, said first cell type including first, second, third, and fourth transistors, said first transistor having a first gate, said second transistor having a second gate, said third transistor having a third gate, and said fourth transistor having a fourth gate, said first and second transistors being of the n-channel type and said third and fourth transistor being of the p-channel type, said first and second gates separated by a first distance, said third and fourth gates separated by approximately said first distance;

said second cell type including fifth, sixth, seventh, and eighth transistors, said fifth transistor having a fifth gate, said sixth transistor having a sixth gate, said seventh transistor having a seventh gate, and said eighth transistor having an eighth gate, said fifth and sixth transistors being of the n-channel type and said seventh and eighth transistors being of the p-channel type, said fifth and sixth gates separated by a second distance, said seventh and eighth moats separated by approximately said second distance, wherein said second distance is greater than said first distance.

10. The integrated circuit of claim 9, further comprising a bus disposed adjacent said array, said bus coupled to said array at a contact area between said fifth and sixth and said seventh and eighth gates.

11. The integrated circuit of claim 9, further comprising a pair of access transistors coupling each of said storage cells in said array with a pair of bitlines.

* * * * *